United States Patent [19]
Jun

[11] Patent Number: 5,362,664
[45] Date of Patent: Nov. 8, 1994

[54] METHOD FOR FABRICATING A SEMICONDUCTOR MEMORY DEVICE

[75] Inventor: Young K. Jun, Seoul, Rep. of Korea

[73] Assignee: Gold Star Electron Co., Ltd., Rep. of Korea

[21] Appl. No.: 190,304

[22] Filed: Feb. 2, 1994

[30] Foreign Application Priority Data

Jan. 12, 1994 [KR] Rep. of Korea ............... 1994 426

[51] Int. Cl.⁵ ........................................... H01L 21/70
[52] U.S. Cl. ................................. 437/52; 437/47; 437/60; 437/919
[58] Field of Search ............... 437/47, 48, 52, 60, 437/919; 257/307, 308

[56] References Cited

U.S. PATENT DOCUMENTS

| | | |
|---|---|---|
| 4,742,018 | 5/1988 | Kimura et al. |
| 5,053,351 | 10/1991 | Fazan et al. ............ 437/52 |
| 5,071,781 | 12/1991 | Seo et al. ............... 437/52 |
| 5,102,820 | 4/1992 | Chiba .................... 437/52 |
| 5,164,337 | 11/1992 | Ogasawa et al. ....... 437/919 |
| 5,223,448 | 6/1993 | Su ........................ 437/52 |

Primary Examiner—Tom Thomas
Attorney, Agent, or Firm—Poms, Smith, Lande & Rose

[57] ABSTRACT

This invention relates to a method for fabricating a semiconductor memory device with a large capacitance, which comprises the steps of forming a gate insulating film, a gate electrode and a source and drain region on a semiconductor substrate, forming an interlayer and an etch stopper on the whole surface, etching selectively away the etch stopper and the interlayer to form an opening, forming a first conductive layer, a first insulating film and a second insulating film on the whole surface, etching selectively away the first and second insulating film, forming a side wall spacer of a third insulating film on the side of the first and second insulating film, forming a fourth insulating film on the whole surface, etching selectively away the fourth insulating film, removing the second insulating film and the side wall spacer, forming a second conductive layer on the whole surface, etching selectively away the second conductive layer and the first insulating film and the first conductive layer, removing the fourth insulating film and the first insulating film.

10 Claims, 7 Drawing Sheets

F I G.3
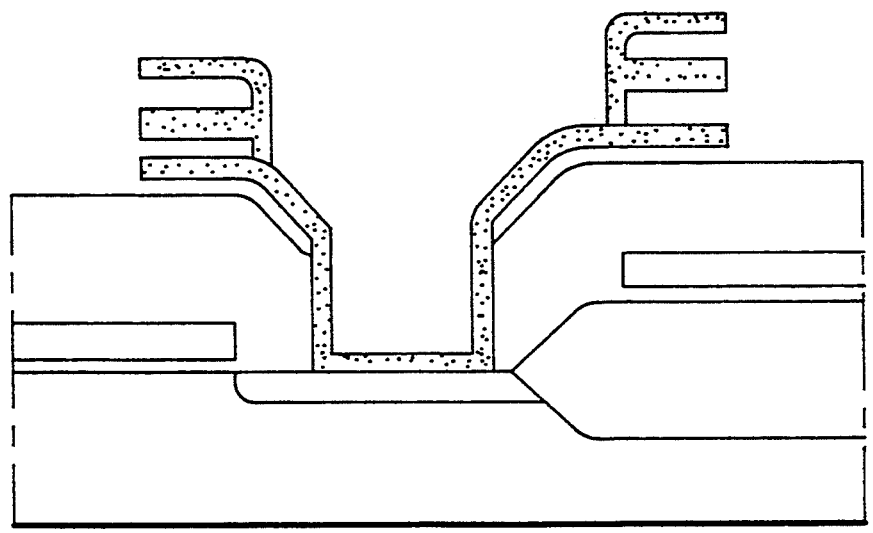

METHOD FOR FABRICATING A SEMICONDUCTOR MEMORY DEVICE

FIELD OF THE INVENTION

This invention relates to a method for fabricating a semiconductor memory device with a large capacitance.

BACKGROUND OF THE INVENTION

Recent, developments have included various techniques for increasing the density of integration of the semiconductor memory device. In a dynamic random access memory (DRAM), various cell structures are proposed for miniaturizing the size of the device.

In view of miniaturizing the size of the device for increasing the density of integration, it is preferable that memory cell has one transistor and one capacitor. In the memory cell having one transistor and one capacitor, electric charges are stored at storage node of the capacitor connected to the transistor (switching transistor).

If the size of the memory cell is miniaturized by increasing the density of integration, the size of the capacitor is small and the number of the electric charges to be stored at the storage node are decreased. However, the storage node should have a predetermined surface area so that the capacitance for transmitting a desired signal without error can be provided. To miniature the size of memory cell, the storage node of the capacitor is to have the large surface area relatively in a limited area.

Among the proposed memory cell structures, a stack capacitor has an advantage that the high density of integration is profitable and the effect of soft error is reduced. Also, the memory cell having the stack capacitor is suitable to a mass production and the processes for fabricating thereof is easy.

The structure of stack capacitor for increasing the capacitance of capacitor is disclosed in, e.g., U.S. Pat. No. 4,742,018.

FIG. 1(a) to 1(g) are sectional views showing the production steps of the conventional art.

In FIG. 1(a), there is a p-type silicon substrate 1 on which a switching transistor is formed. The transistor includes n-type semiconductor regions to be used as the source and drain regions and a gate 2 and a gate insulator 3. After a first oxide film 6 is deposited on the whole surface, selective etching is performed to form contact holes so that the source and drain regions 5 are exposed.

A first conductive layer 8 is deposited thereon so that the first conductive layer 8 is connected to the source and drain region 5 through the contact hole, as shown in FIG. 2(b). And the first conductive layer 8 is patterned by photolithography technique using a capacitor storage node pattern.

A second oxide film 9 is deposited thereon and is selectively etched away so that a contact hole is formed to expose a part of the first conductive layer 8, as shown in FIG. 1(c).

A second conductive layer 10 is deposited thereon to connect to the first conductive layer 8 electrically through the contact hole formed at the second oxide layer 9, as shown in FIG. 1(d).

And the second conductive layer 10 is patterned by using the capacitor storage node pattern.

The second oxide layer 9 is removed by wet etching to form a capacitor storage node 11 including the first conductive layer 8 and the second conductive layer 10, as shown in FIG. 1(e).

A capacitor dielectric film 12 is formed on the exposed surface of the storage node 11 as shown in FIG. 1(f). A conductive material is deposited on the capacitor dielectric film 12 and is patterned to form a capacitor plate electrode, as shown in FIG. 1(g).

However, for fabricating the capacitor of multi-layer to increase furthermore the capacitance of the capacitor, it is a problem that the processes are added and the soft error is placed.

SUMMARY OF THE INVENTION

An object of this invention is to provide a method for fabricating a semiconductor memory device which can increase the capacitance.

This and other objects are achieved by providing a method for fabricating a semiconductor memory device, comprising the steps of:

forming a gate insulating film on a semiconductor substrate;

forming a gate electrode on the gate insulating film;

forming a source and drain region in the semiconductor substrate at each side of the gate electrode;

forming an interlayer and an etch stopper on the whole surface;

etching selectively away the etch stopper and the interlayer to form an opening, the opening exposing the source and drain region;

forming a first conductive layer on the whole surface;

forming a first insulating film and a second insulating film on the whole surface, the second insulating film being etched selectively with the first insulating film; etching selectively away the first and second insulating film to expose the first conductive layer at a part of the opening;

forming a side wall spacer of a third insulating film on the side of the first and second insulating film, the side wall spacer being the same material as the second insulating film;

forming a fourth insulating film on the whole surface;

etching selectively away the fourth insulating film to expose the second insulating film; removing the second insulating film and the side wall spacer;

forming a second conductive layer on the whole surface;

etching selectively away the second conductive layer and the first insulating film and the first conductive layer by using the fourth insulating film as a mask;

removing the fourth insulating film and the first insulating film.

BRIEF DESCRIPTION OF THE DRAWINGS

FIG. 3 is a sectional view showing the production step in accordance with other embodiment of this invention.

DETAILED DESCRIPTION OF THE INVENTION

Figure 1A:
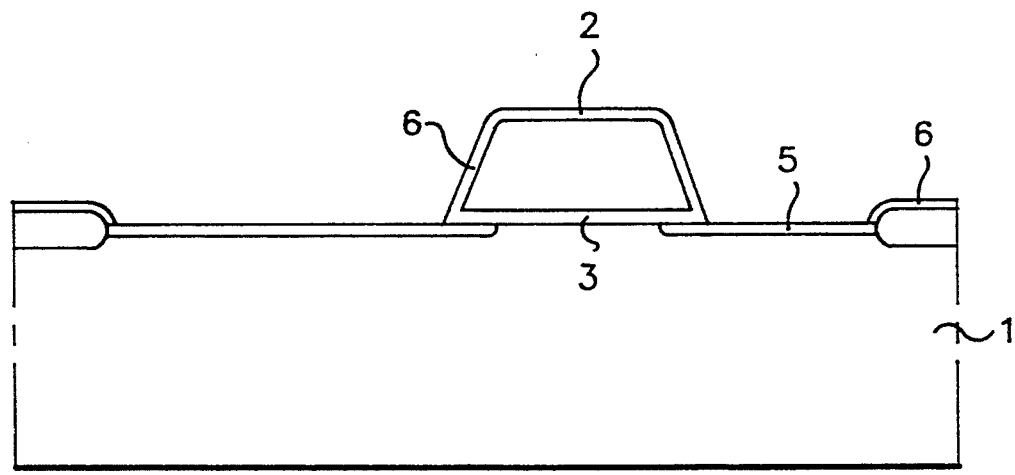
FIGS. 1(a) to 1(g) are sectional views showing the production steps of the conventional art.
Figure 1B:
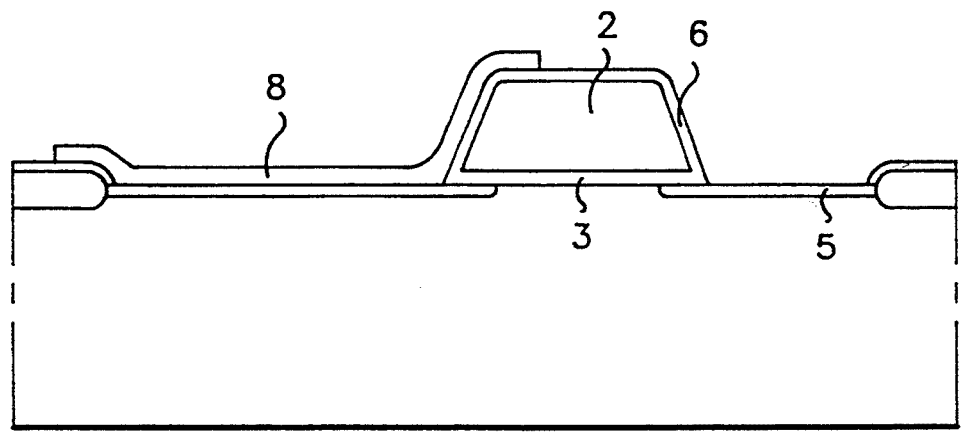
Figure 1C:
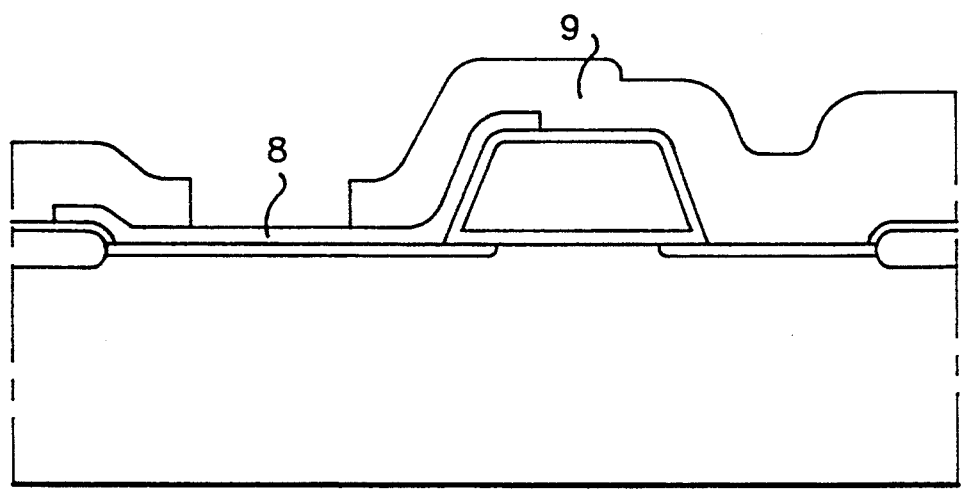
Figure 1D:
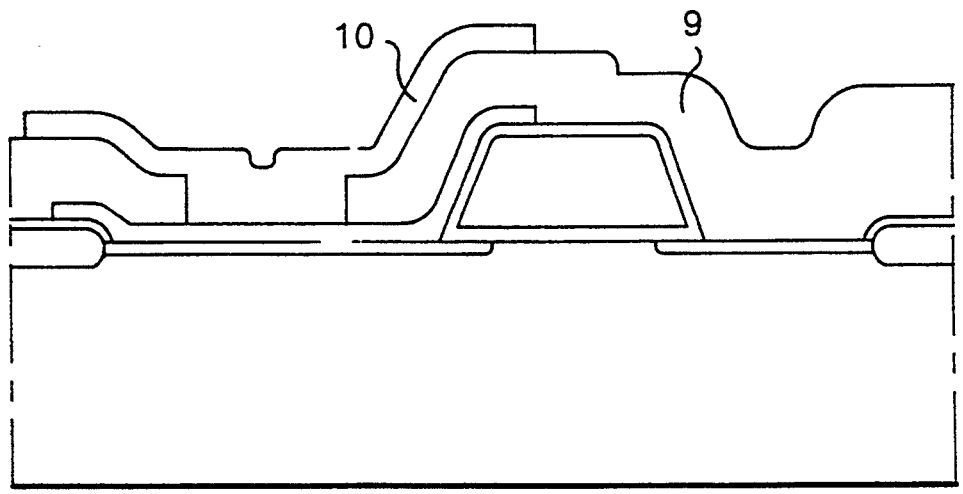
Figure 1E:
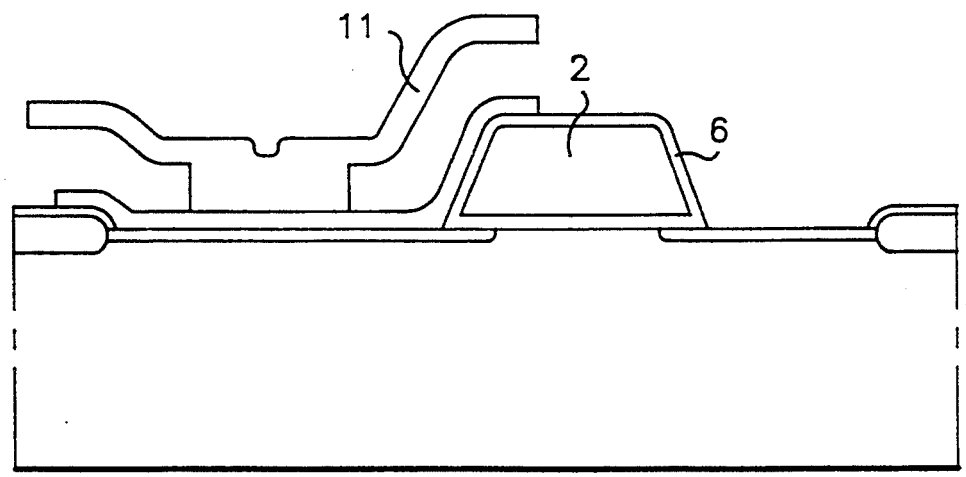
Figure 1F:
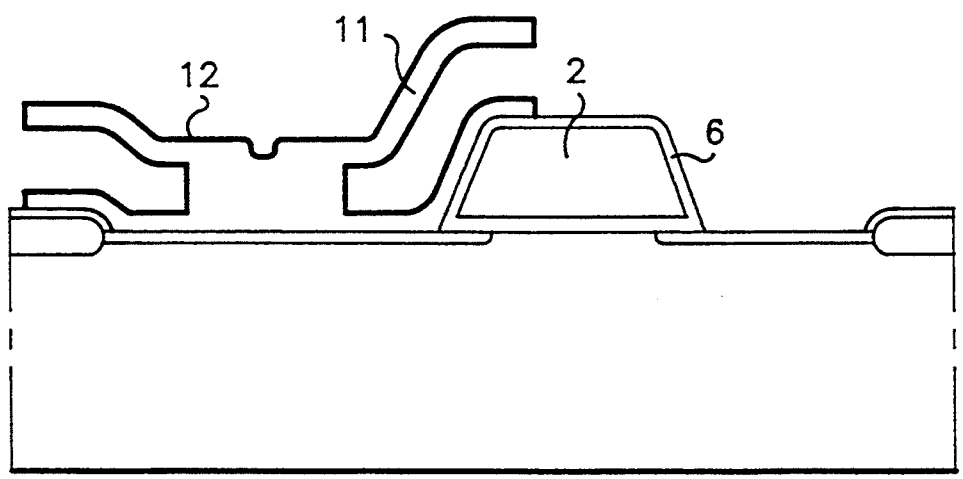
Figure 1G:
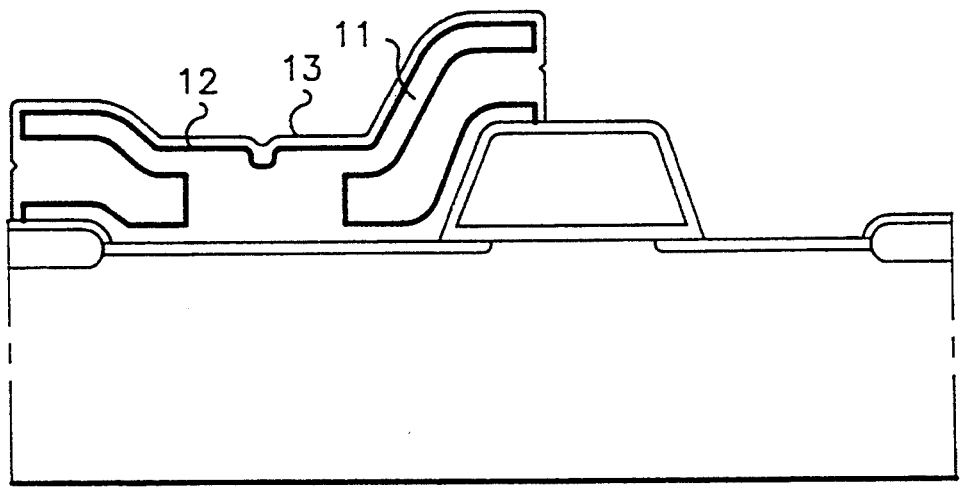

FIGS. 2(a) to 2(i) are sectional views showing the production steps in accordance with an embodiment of this invention.

In FIG. (2), there is a p-type semiconductor substrate 1 in which an active area and an isolation area are defined by local oxidation of silicon (LOCOS) processes. A gate insulating film 3 and a conductive layer 4 for a gate electrode are formed thereon and are patterned by a photolithography technique using a gate electrode pattern to form the gate electrode 4. An n-type impurities are ion-implanted in the gate electrode 4 in self-alignment and the heat treatment is performed so that source and drain region 5 is formed in the active area. Thus, a transistor of memory cell is obtained. And, an interlayer 21 for example an oxide film, for insulating the transistor is formed on the whole surface, an etch stopper (a nitride film) 22 of about 1000 angstroms thickness are formed thereon by a chemical vapor deposition method (CVD) or a plasma enhanced chemical vapor deposition method (PECVD).

Figure 2A:
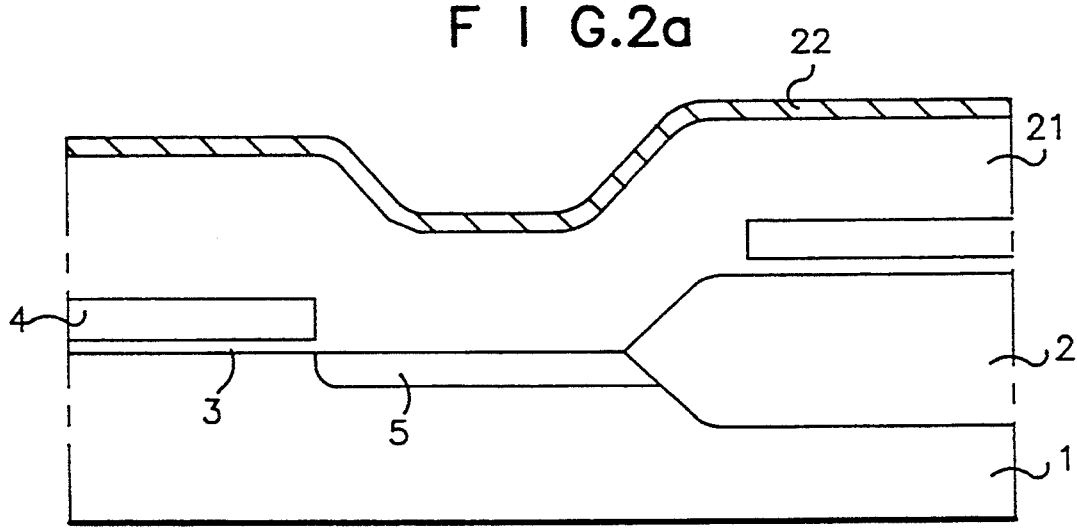
FIGS. 2(a) to 2(i) are sectional views showing the production steps in accordance with an embodiment of this invention.
Figure 2B:
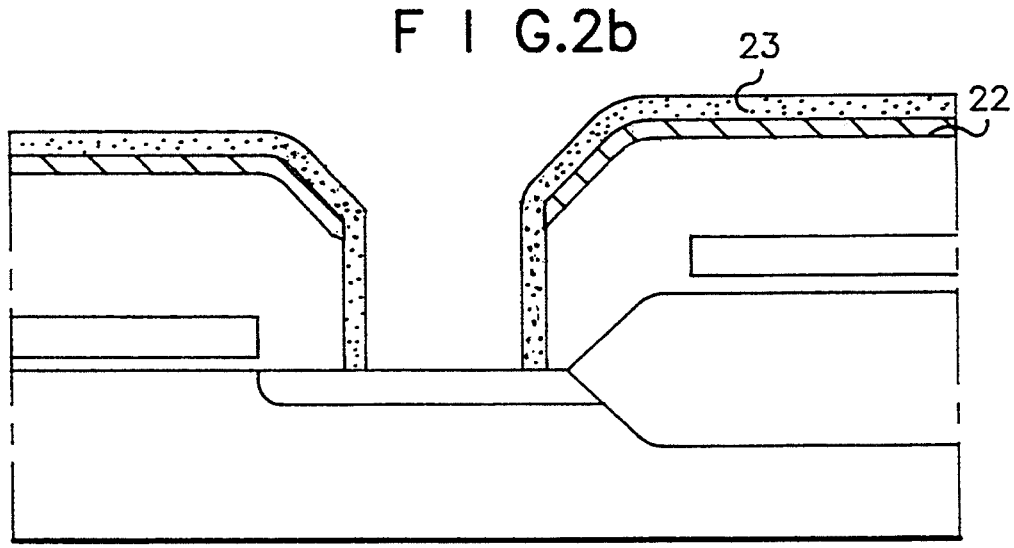

A photo resist (not shown) is deposited on the etch stopper 22 and is patterned to form a photo resist pattern, as shown in FIG. 2(b). The nitride film 22 and the oxide film 21 are etched away by a reactive ion etch method (RIE) using the photo resist pattern so that an opening to expose the source and drain region 5 is formed. Here, CHF3/O2 or CF4 is used as an etching gas. And a first conductive layer 23 is deposited on the whole surface to connect to the source and drain region 5. It is preferable that the first conductive layer 23 is an amorphous silicon layer or polysilicon layer in which impurities are doped by the LPCVD method using SiH4 or Si2H6 and PH3 of dopant.

Figure 2C:
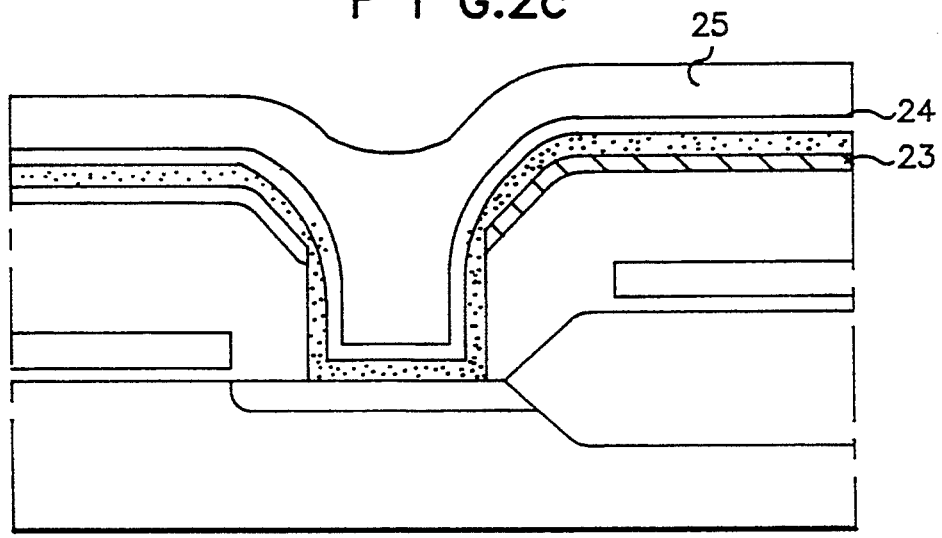

A first insulating film 24 and a second insulating film 25 which can be etched selectively with the first insulating film 24, are deposited thereon, as shown in FIG. 2(c). It is preferable that an oxide film of about 1000 angstroms thickness is used as the first insulating film 24 which is formed by the CVD or PECVD method and a nitride film is used as the second insulating film 25 of about 3000 angstroms thickness which is formed by the CVD or PECVD method.

Figure 2D:
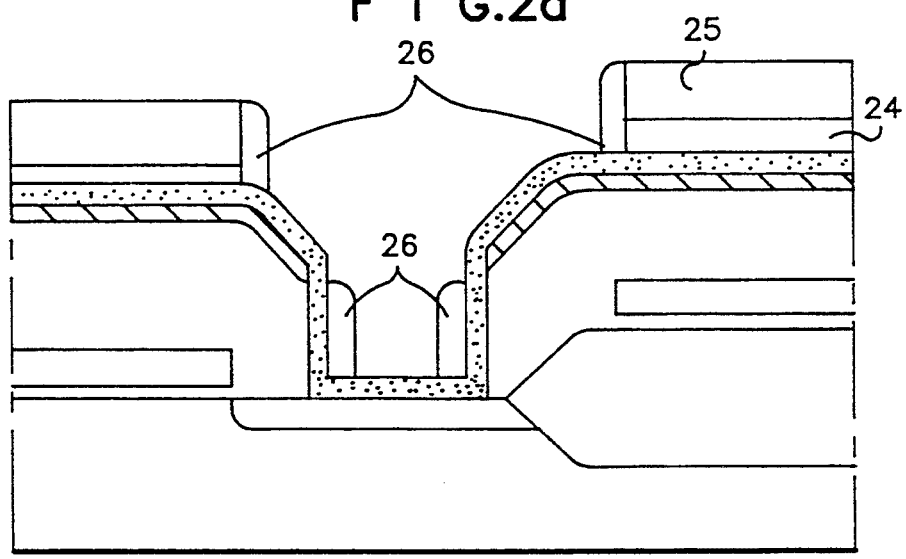

The second insulating film 25 and the first insulating film 24 are selectively etched away to expose the first conductive layer 23 in the opening part of the source and drain region 5, as shown in FIG. 2(d). Here, the second insulating film 25 and the first insulating film 24 are successively etched away by using a predetermined photo resist pattern through the photolithography processes.

After a third insulating film (a nitride film) of about 1000 angstroms thickness being the same material as the second insulating film 25 is deposited thereon by the CVD or PECVD method, the third insulating film is etched back so that a side wall spacer 26 is formed at the side of the first and second insulating film 24 and 25. The side wall spacer 26 may be remained at the side of the first conductive layer 23.

Figure 2E:
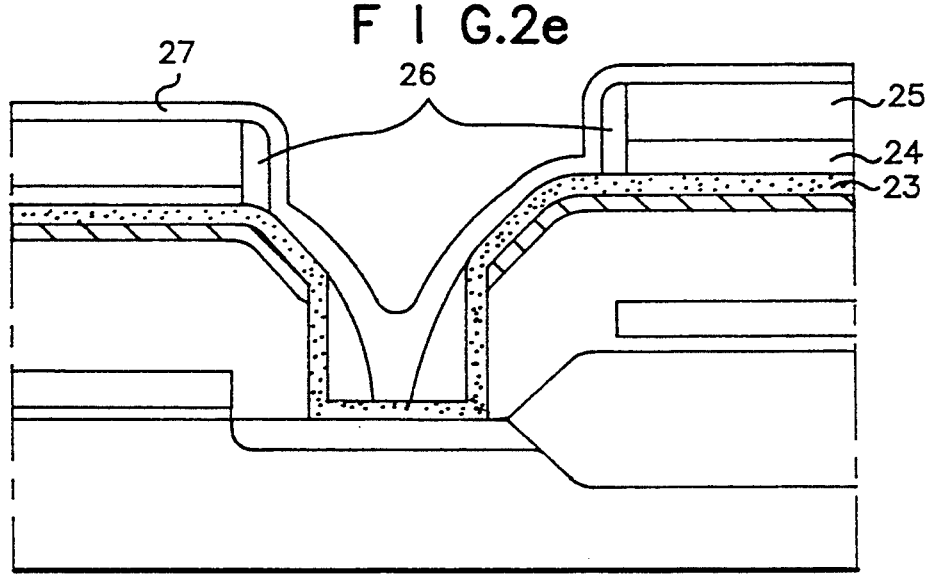

A fourth insulating film 27 (an oxide film) of about 1500 to 2000 angstroms thickness is deposited on the whole surface in the thickness more than the first insulating film 24 by the CVD or PECVD method, as shown in FIG. 2(e).

Figure 2F:
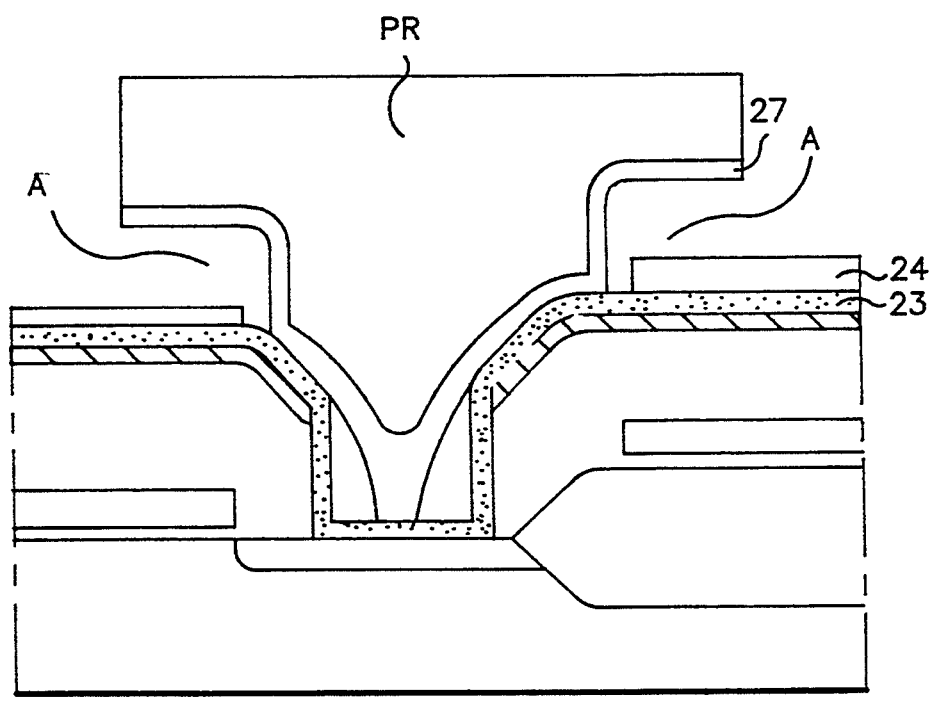

After a photo resist is deposited on the fourth insulating film 27 and is patterned by the photolithography processes to form a photo resist pattern PR, the fourth insulating film 27 is selectively etched away by using the photo resist pattern PR as a mask, as shown in FIG. 2(f). The side wall spacer 26 of the second and third insulating film 24 and 25 is removed by wet etching using solution of H3PO4 so that a space A is formed between the fourth insulating film 27 and the first insulating film 24.

Figure 2G:
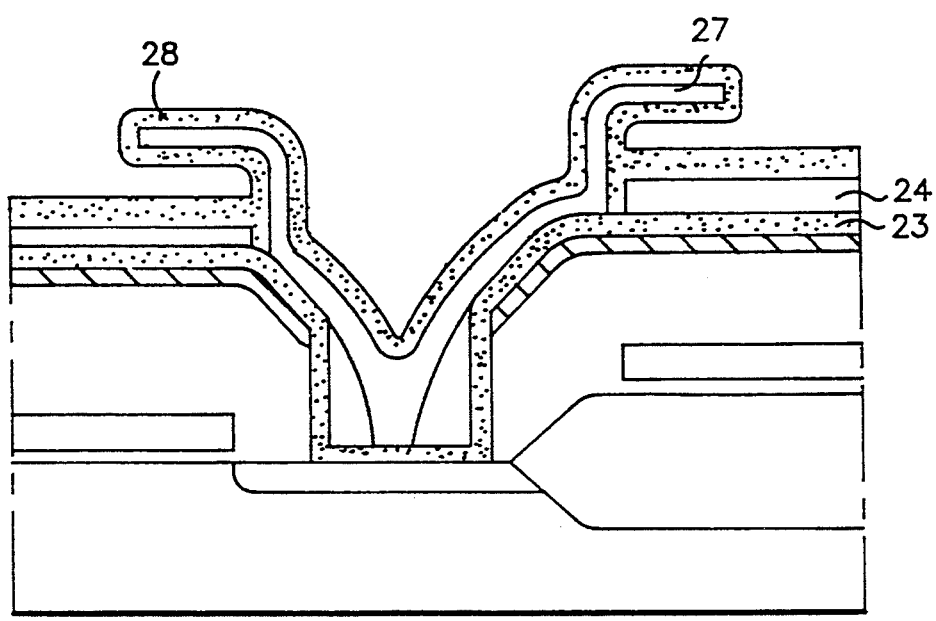

A second conductive layer 28 is formed on the exposed surface of the first and the fourth insulating film 24 and 27 by depositing a silicon film of about 1000 angstroms thickness in which impurities are doped, under 520 to 620 degrees C. by LPCVD method, as shown in FIG. 2(g).

Figure 2H:
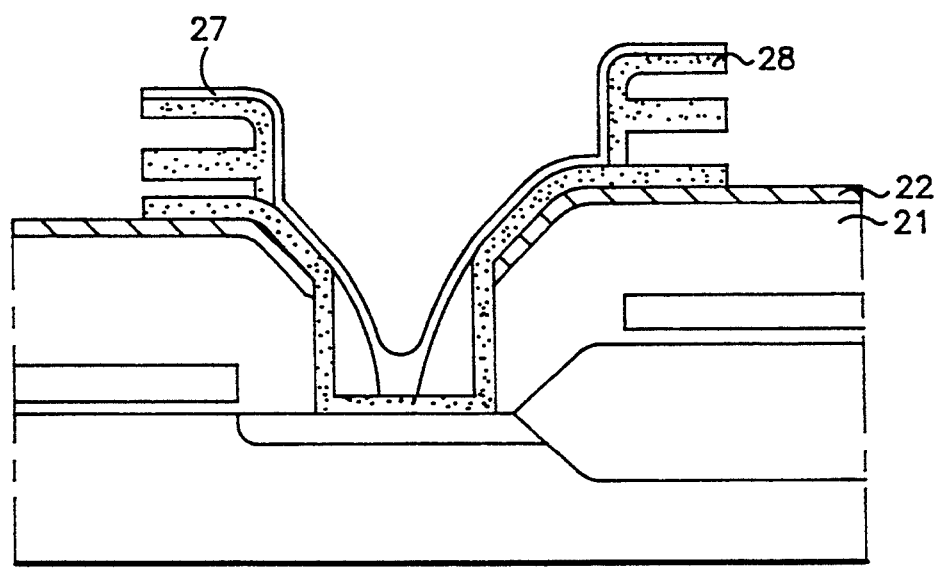

The second conductive layer 28, the first insulating film 24 and the first conductive 23 are successively etched away by the RIE method using the fourth insulating film 27 as a mask without an additional photo resist, as shown in FIG. 2(h). Though the fourth insulating film 27 and the first insulating film 24 are the same oxide film, the thickness of the fourth insulating film 27 is more than that of the first insulating film 24. Accordingly, the fourth insulating film 27 is remained though the first insulating film 24 is over etched, so that the first conductive layer 23 can be etched away by using the remained insulating film 27 as a mask.

For example, if the thickness of the fourth insulating film 27 is tTop and the thickness of the first insulating film 24 is tBott and the over etched amount of the first insulating film 24 is P (percent), the thickness of the fourth insulating is determined as follows.

$$tTop > (1+\alpha)tBott$$

Figure 2I:
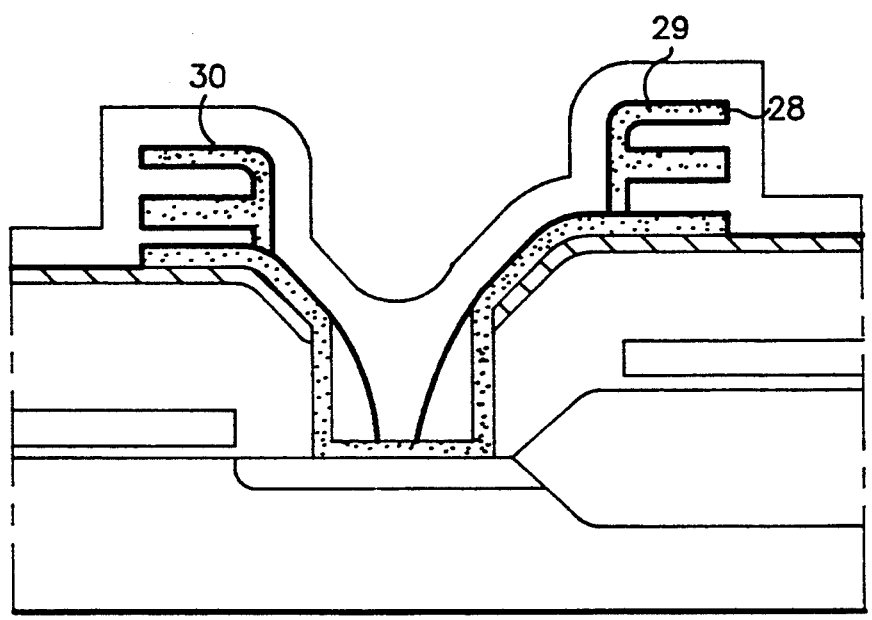

The remained first and fourth insulating film 24 and 27 are etched away by wet etching using the nitride film as an etch stopper and HF contained solution, thus three dimensional structure of a capacitor storage node is obtained which the second conductive layer 28 is connected to the first conductive layer 23, as shown FIG. 2(i). And a dielectric film 29 is formed on the surface of the capacitor storage node by conventional processes and a capacitor plate electrode 30 is formed thereon, so that the processes for fabricating the capacitor are completed.

FIG. 3 is a sectional view showing the production step in accordance with other embodiment of this invention. After the capacitor storage node is formed, the nitride film 22 and the side wall 26 of the first conductive layer 23 may be etched away by wet etching using H3PO4 contained solution or isotropic dry etching, as shown in FIG. 3.

If the nitride film is removed, the surface of the exposed first conductive layer can be applied to increase furthermore the capacitance of the capacitor.

As explained in detail above, according to this invention, the capacitor storage node can be formed easily by applying the three dimensional space using the insulating films so that the capacitance of the capacitor is increased to contribute the high density of integration in the semiconductor memory device.

What is claimed is:

1. A method for fabricating a semiconductor memory device, comprising the steps of:
   forming a gate insulating film on a semiconductor substrate;
   forming a gate electrode on the gate insulating film;
   forming a source and drain region in the semiconductor substrate at each side of the gate electrode;
   forming an interlayer and an etch stopper on the whole surface;
   etching selectively away the etch stopper and the interlayer to form an opening, the opening exposing the source and drain region;

forming a first conductive layer on the whole surface;
forming a first insulating film and a second insulating film on the whole surface, the second insulating film being etched selectively with the first insulating film;
etching selectively away the first and second insulating film to expose the first conductive layer at a part of the opening;
forming a side wall spacer of a third insulating film on the side of the first and second insulating film, the side wall spacer being the same material as the second insulating film;
forming a fourth insulating film on the whole surface;
etching selectively away the fourth insulating film to expose the second insulating film;
removing the second insulating film and the side wall spacer;
forming a second conductive layer on the whole surface;
etching selectively away the second conductive layer and the first insulating film and the first conductive layer by using the fourth insulating film as a mask;
removing the fourth insulating film and the first insulating film.

2. A method according to claim 1, wherein the first and fourth insulating film is an oxide film.

3. A method according to claim 1, wherein the second insulating film is a nitride film.

4. A method according to claim 1, wherein the step of forming the side wall spacer includes the substeps of etching selectively away the first insulating film and the second insulating film and forming the third insulating film being the sane material as the second insulating film on the whole surface, and etching back the third insulating film.

5. A method according to claim 1, wherein the step of removing the second insulating film and the side wall spacer is performed by wet etching using H3PO4 contained solution.

6. A method according to claim 1, wherein the fourth insulating film is the same material as the first insulating film.

7. A method according to claim 1, wherein the thickness of the fourth insulating film is more than that of the first insulating film.

8. A method according to claim 7, wherein the thickness of the fourth insulating film is tTop and the thickness of the first insulating film is tBott and the etched over amount of the first insulating is P(percent), the thickness of the fourth insulating film is determined as follows.

$$tTop > (1+\alpha)tBott$$

9. A method according to claim 1, wherein the step of removing the fourth insulating film and the first insulating film is performed by wet etching using HF contained solution.

10. A method according to claim 1, further comprising the step of removing the etch stopper and a remained side wall spacer after removing the fourth insulating film and the first insulating film.

* * * * *